United States Patent [19]

Lodini

[11] Patent Number: 4,837,548

[45] Date of Patent: Jun. 6, 1989

[54] ELECTRIC RESISTOR DESIGNED FOR USE AS AN ELECTRIC CONDUCTING ELEMENT IN AN ELECTRIC CIRCUIT, AND RELATIVE MANUFACTURING PROCESS

[75] Inventor: Paolo Lodini, Turin, Italy

[73] Assignee: Leda Logarithmic Electrical Devices for Automation S.r.l, Turin, Italy

[21] Appl. No.: 145,611

[22] Filed: Jan. 19, 1988

[30] Foreign Application Priority Data

Feb. 5, 1987 [IT] Italy .............................. 67073 A/87

[51] Int. Cl.⁴ .............................................. H01L 10/10

[52] U.S. Cl. ....................................... 338/47; 338/114; 29/610.1

[58] Field of Search ................... 338/47, 99, 112, 114, 338/48; 29/610.1

[56] References Cited

U.S. PATENT DOCUMENTS

| | | | |
|---|---|---|---|
| 2,042,606 | 6/1936 | Kotowski | 338/99 X |
| 3,125,739 | 3/1964 | Deibel et al. | 338/99 |
| 3,341,797 | 9/1967 | Watson | 338/47 |
| 3,629,774 | 12/1971 | Crites | 338/114 |
| 4,503,416 | 3/1985 | Kim | 338/99 |
| 4,659,873 | 4/1987 | Gibson et al. | 338/99 X |

*Primary Examiner*—E. A. Goldberg

*Assistant Examiner*—Marvin M. Lateef

*Attorney, Agent, or Firm*—Klauber & Jackson

[57] ABSTRACT

A resistor is formed from a structure including at least one network of electrically conductive wires, and a matrix for supporting the aforementioned structure, the matrix formed from a flexible, electrically insulating material inside which the aforementioned structure is sunk, with a number of surface portions of the wires in the aforementioned networks being separated by small gaps, the resistor being formed by a manufacturing process substantially including the steps of forming a system including a structure having at least one network of electrically conductive wires, and arranging a liquid material between the wires of the aforementioned networks in the aforementioned structure, the aforementioned liquid material being designed to assume a state in which it is both solid and flexible; and in subsequently solidifying the aforementioned material in such a manner as to form a solid, flexible matrix for supporting the aforementioned structure.

13 Claims, 4 Drawing Sheets

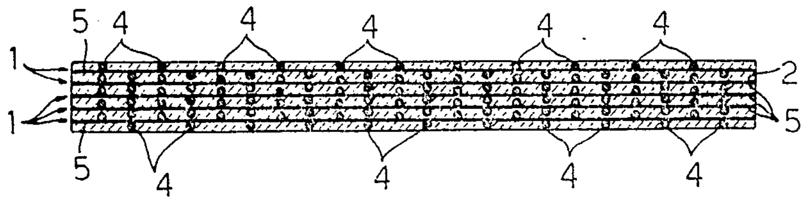
Fig.1
Fig.2
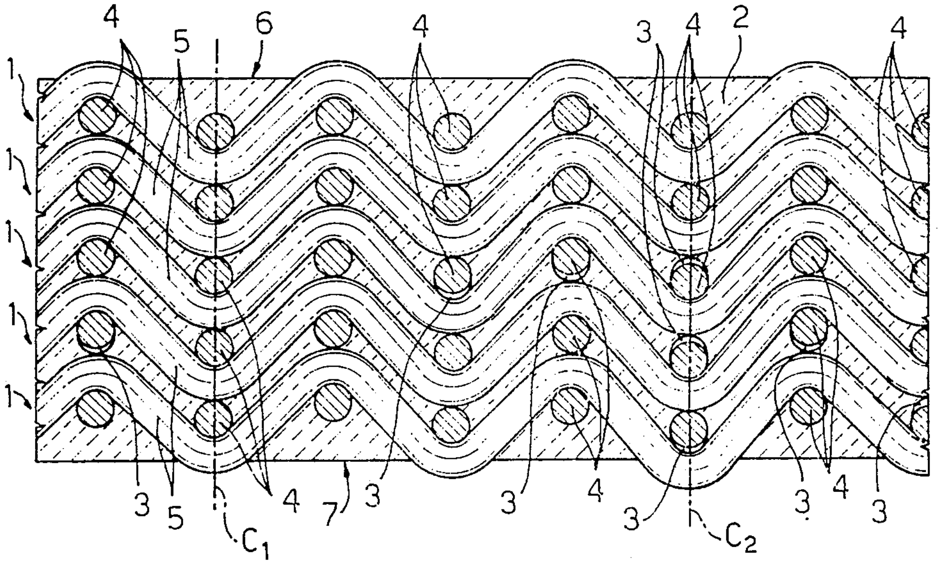

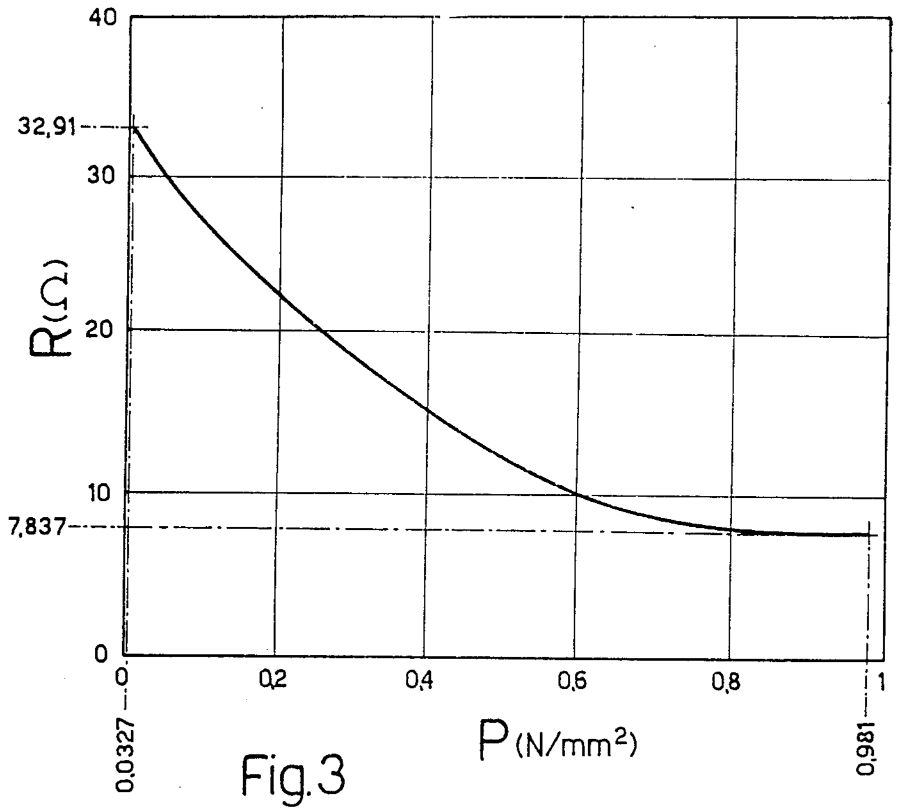
Fig.3
Fig.6
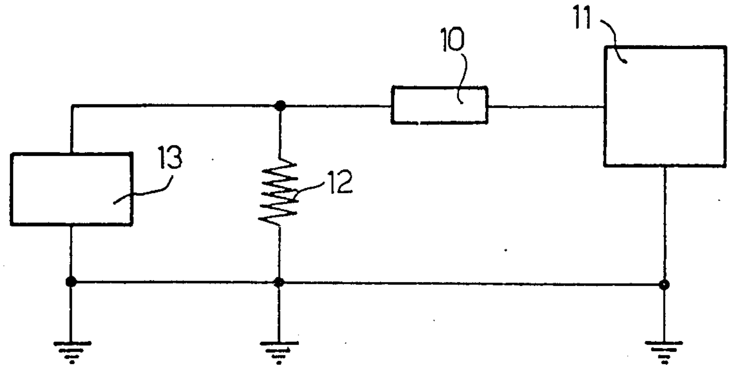

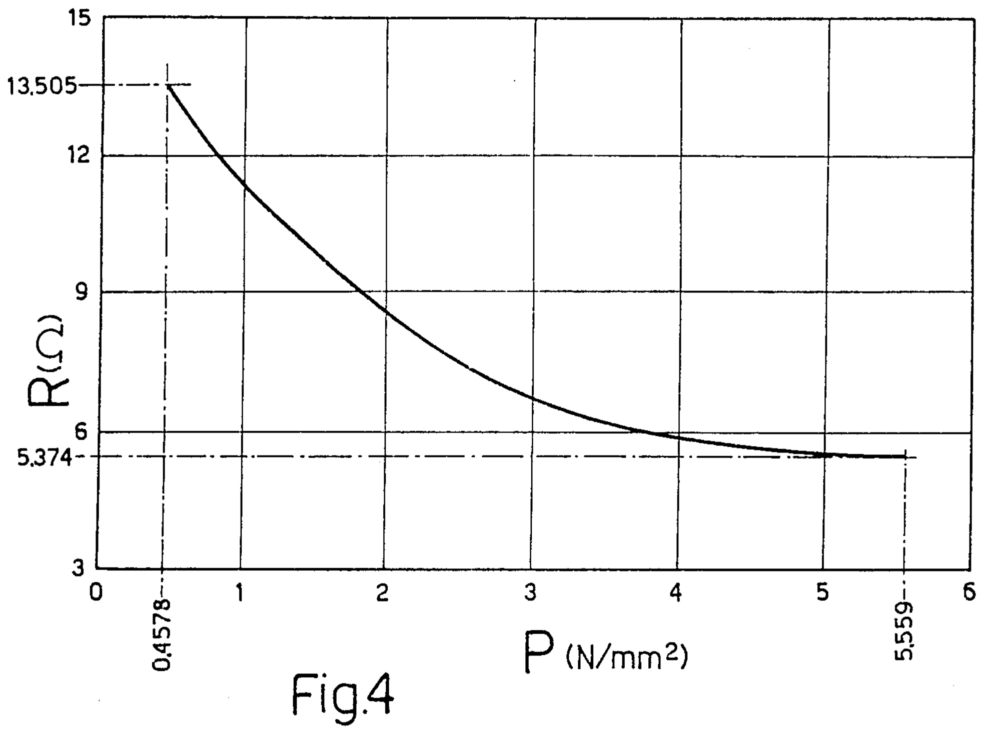
Fig.4
Fig.5
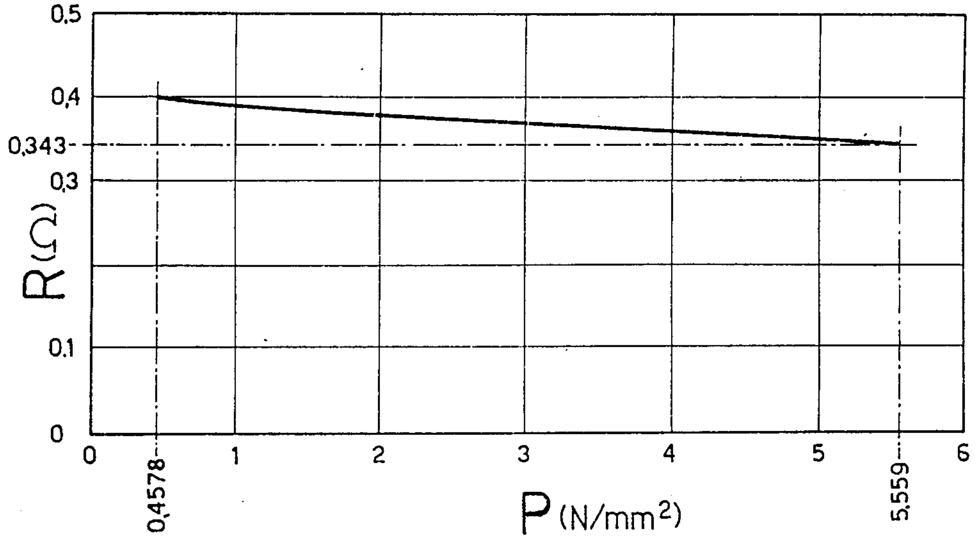

ELECTRIC RESISTOR DESIGNED FOR USE AS AN ELECTRIC CONDUCTING ELEMENT IN AN ELECTRIC CIRCUIT, AND RELATIVE MANUFACTURING PROCESS

BACKGROUND OF THE INVENTION

The present invention relates to an electric resistor designed for use as an electric conducting element in an electric circuit, said resistor presenting a given resistivity selectable from within a wide range and, more especially, being capable of varying its electrical resistance as a function of the pressure exerted on the resistor itself.

The conducting elements employed in electric circuits usually consisting of localized rheophores or resistors present a specific resistance depending on the size of the elements and the electrical characteristics of the materials from which they are made. For varying the electrical resistance of any one of the said conducting elements, the latter must be fitted with a variable resistor, which usually consists of a device comprising a very long resistor of which is used only a given portion presenting a given resistance between one end of the resistor and a slide travelling along the same. In addition to being highly complex, and therefore also expensive, a major drawback of variable resistors of the aforementioned type is that operation requires moving the slide along the resistor.

On certain types of known resistors, resistance is varied by altering the length of the resistor itself, subsequent to deformation of the parts to which the resistor is fitted (electrical straingauges). In this case, however, the resulting resistance changes must be amplified for worthwhile signals to be obtained. What is more, resistors of this type can only be supplied with very low current, which rules out any possibility of their being employed as effective conducting elements in electric circuits.

SUMMARY OF THE INVENTION

The aim of the present invention is to provide an electric resistor which may be employed as an effective conducting element in an electric circuit; which presents a given resistivity selectable from within a wide range; and the resistivity of which may be varied simply as a function of the pressure exerted on the resistor itself. The resistor according to the present invention is characterised by the fact that it comprises a structure consisting of at least one network of electrically conductive wires, and a matrix for supporting the said structure and formed from a flexible, electrically insulating material inside which the said structure is sunk; a number of surface portions of the wires in the said networks being separated by small gaps.

A further aim of the present invention is to provide a process for manufacturing an electric resistor featuring the aforementioned characteristics.

The said process is characterised by the fact that it consists in forming a system comprising a structure consisting of at least one network of electrically conductive wires, and a liquid material arranged between the wires of the said networks in the said structure, said liquid material being designed to assume a state wherein it is both solid and flexible; and in subsequently solidifying the said material in such a manner as to form a solid, flexible matrix for supporting the said structure.

BRIEF DESCRIPTION OF THE DRAWINGS

For clearly illustrating the structural characteristics and advantages of the electric resistor according to the present invention, and the various stages in the process for producing the same, both will now be described in more detail with reference to the accompaying drawings, in which:

FIGS. 1 and 2 show two structural sections, to different scales of a portion of the resistor according to the present invention;

Figure 7:
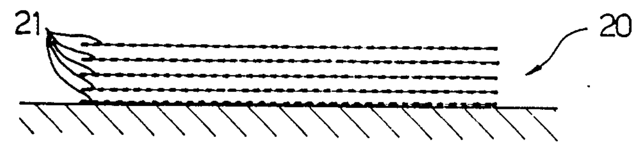
Figure 8:
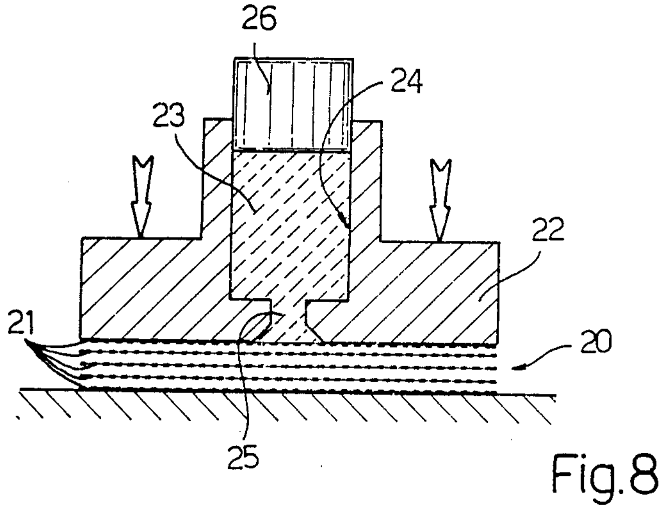
Figure 9:
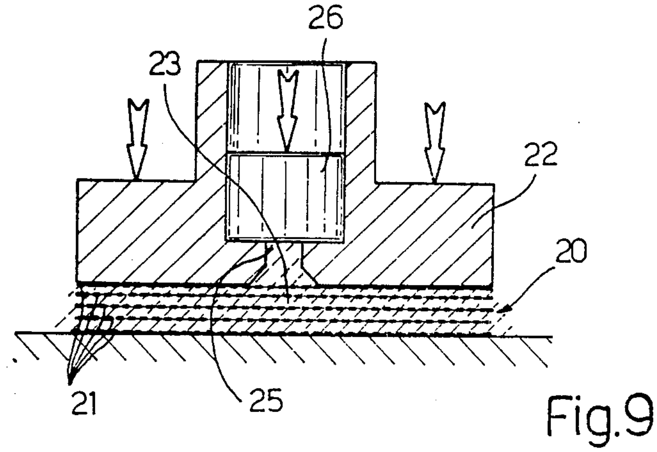

The graphs in FIGS. 3 to 5 show the variation in electrical resistance of the resistor according to the present invention, as a function of the pressure exerted on the resistor itself;

FIG. 6 shows a schesmativ diagram of a test circuit arrangement for plotting the results shown in FIGS. 3 to 5;

FIGS. 7 to 9 show schematic diagrams of the basic stages in the process for producing the electric resistor according to the present invention.

DETAILED DESCRIPTION OF THE INVENTION

The electric resistor according to the present invention may be employed as a conducting element in any type of electric circuit. Though presenting a given resistivity, like any type of rheophore, this may be selected from within an extremely wide range, and may even be low enough to produce an effective conductor enabling high density current supply, as required for supplying electric circuit components or devices. This is illustrated in more detail later on with reference to the electrical characteristics of the resistor in Example 3.

The structure of the resistor according to the present invention is as shown in FIGS. 1 and 2, which show sections of a portion of the resistor enlarged a few hundred times.

The resistor according to the present invention substantially comprises a structure consisting of a number of networks 1 of electrically conductive wires, and a matrix 2 for supporting the said structure and formed from a flexible, electrically insulating material. Inside the said matrix, the said structural networks 1 are sunk in such a manner as to form small gaps 3 (FIG.2) between a number of surface portions of the wires in the said networks.

The wires in each of networks 1 may be arranged in any manner. As such, the said networks may present a first set of warp wires 4 and a second set of weft wires 5 woven between the warp wires as shown in FIG. 2. Any angle may be formed between the warp and weft wire axes. Alternatively, each of the said networks may present an entirely different structure formed, for example, from a single wire instead of two sets of wires.

The wires of networks 1 are conveniently formed from electrically conductive material, such as steel or an appropriate metal alloy. Alternatively, the said wires may present a core of any material, even non-conductive, coated with an electrically conductive material.

Matrix 2 may be formed from any type of electrically insulating material, providing it is flexible enough to flex, when a given pressure is applied on the resistor, and return to its original shape when such pressure is released. Furthermore, the material used for the matrix must be capable of assuming a first state, in which it is sufficiently liquid for it to be injected into the said network structure, and a second state in which it is both solid and flexible. Matrix 2 may conveniently be formed from synthetic resin, preferably a synthetic thermoplastic resin, which presents all the aforementioned characteristics and is thus especially suitable for injection into a network structure of the aforementioned type.

Though the size of each wire 4 and 5, which depends on the size of the resistor being produced, is not a critical factor, the said wires preferably present a diameter of a few hundredths of a millimetre.

With the structure described and illustrated in FIGS. 1 and FIGS. 2, the resistor according to the present invention therefore presents an extremely large number of contact points between the wires in the networks forming the said structure. Such contact points exist both between warp wires 4 and weft wires 5 in the same network, and between the wires in adjacent networks. The number of the said contact points obviously depends on the type of structural network selected, and the process adopted for producing the resistor, as described later on. The wires in the same or adjacent networks may, however, be separated by a thin layer of the material from which matrix 2 is formed, or by gaps 3. As such, electrical conductors may be defined inside the structure, each consisting of a chain comprising numerous contact points between the wires in the various networks, and each electrically connecting end surfaces 6 and 7 on the resistor directly. A contact chain of this type is shown by dotted line C1. Alternatively, there may be formed, inside the resistor, chains such as the one indicated by dotted line C2, wherein the network wires are partly contacting and partly separated solely by gaps 3. Such chains may be rendered electrically conductive, as in the case of chains C1, when sufficient pressure is applied on surfaces 6 and 7 of the resistor for flexing the material of matrix 2 and so bridging the said gaps and bringing the wires into direct contact. Though networks 1 in FIGS. 1 and 2 form a substantially neat structure, what has already been said in connection with the contact points between the wires also applies to any type of random network structure formed using networks of any shape or size.

When incorporated in an electric circuit, performance of the resistor according to the present invention is as follows.

If no external pressure is applied on the resistor, and end surfaces 6 and 7 are connected electrically via appropriate conductors, electric current may be fed through the resistor as in any type of rheophore. The density of the current feedable through the resistor has been found to be very high, at times in the region of a few A/cm2. Total resistance of the resistor so formed has been found to be constant, and dependent solely on the structure of the resistor, in particular, the number and length of the contact points between the wires in the structural networks. By appropriately selecting the aforementioned parameters, some of which depend on the process described later on, a resistor may be produced having a given prearranged resistance, measured perpendicularly to the planes in which networks 1 lie.

When pressure is applied perpendicularly to surfaces 6 and 7, the electrical resistance measured perpendicularly to the said surfaces is reduced in direct proportion to the amount of pressure applied. FIGS. 3 to 5 show four resistance-pressure graphs by way of examples and relative to three different types of resistors, the characteristics of which will be discussed later on. As shown in the said graphs, the fall in resistance as a function of pressure is a gradual process represented by a curve (FIGS. 3 and 4) or a substantially straight line (FIG. 5) Even very light pressure, such as might be applied manually, as been found to produce a considerable fall in resistance.

If the pressure applied on the resistor according to the present invention is maintained constant (or zero pressure is applied), electrical performance of the resistor has been found to conform with both Ohm's and Joule's law. For application purposes, it is especially important to prevent the heat generated inside the resistor (Joule effect) from damaging the structure. Assuming the resistor according to the present invention is capable of withstanding an average maximum temperature of 50° C., under normal heat exchange conditions with an ambient air temperature of 20° C., the density of the current feedable through the resistor ranges from 0.3 A/cm2 (Example 1) to 3 A/cm2 (Example 3) providing no external pressure is applied.

In the presence of external pressure, such favourable performance of the electric resistor according to the present invention is probably due to improved electrical conductivity of contact chains such as C1 and C2 in FIG. 2. In fact, as pressure increases, the conductivity of structually-contacting chains (such as C1) increases due to improved electrical contact, both on account of the pressure with which one wire is thrust against another, and the increased contact area between the wires. In addition to this, contact chains such as C2, in which the adjacent wires are separated by gaps 3, also become conductive when a given external pressure is applied for bridging the gaps between adjacent pairs of otherwise non-contacting wires. Total electrical conductivity of the contact chains increases gradually alongside increasing pressure, by virtue of matrix 2 being formed from flexible material. As a result, adjacent wires separated by gaps 3 are gradually brought together, and the contact area of the wires already contacting one another is increased gradually as flexing of the matrix material increases.

Each specific external pressure is obviously related to a given resistor structure and a given total conducting capacity of the same. When external pressure is released , the resistor returns to its initial unflexed configuration and, therefore, also its initial resistance rating.

To illustrate the electrical performance of the resistor according to the present invention, when subjected to varying external pressure, three resistors featuring different structural parameters will now be examined by way of examples.

EXAMPLE 1

A cylindrical, 14 mm diameter resistor was prepared featuring 25 stainless steel networks arranged one on top of the other. Each network presented a wire diameter of 0.03 mm and approximately 14 wires/mm, making a total of approximately 196 meshes/mm2.

The material employed for the matrix was silicon resin. The resistor so formed was connected to the electric circuit in FIG. 6, in which it is indicated by number 10. The said circuit comprises a stabilized power unit 11 (with an output voltage, in this case of 1.2V), a 4.7 Ohm load resistor 12, and a digital voltmeter 13, connected as shown in FIG. 6. Resistor 10 was subjected to pressures ranging from 0.032 N/mm2 to 0.98 N/mm2.

Resistance was measured by measuring the difference in potential at the terminals of resistor 12 using voltmeter 13, and plotted against pressure as shown in the FIG. 3 graph.

EXAMPLE 2

A resistor as in the foregoing Example was prepared, but the pressure exerted on the network 1 structure was raised from 0.65 N/mm2, as in Example 1, to 1.30 N/mm2.

Resistance was measured as in Example 1, to give the resistance-pressure graph shown in FIG. 4.

EXAMPLE 3

A cylindrical, 16 mm diameter resistor was prepared by overlaying 20 stainless steel networks of 0.03 mm wire. Each network presented 14 wires/mm, making a total of approximately 196 meshes/mm2. Matrix 2 was formed from epoxy resin (VB-ST 29), and the network structure subjected to a pressure of 2.4 N/mm2.

Resistance was measured as in the foregoing Examples, to give the resistance-pressure graph shown in FIG. 5. The specific resistance of the resistor material is 3.2 Ohm.cm, which is low enough for the resistor to be considered a conductor.

Assuming heat (Joule effect) is dissipated by normal heat exchange in air at a temperature of 20° C., and the maximum temperature withstandable by the resistor is 50° C., the density of the current feedable through this resistor is approximately 3 A/cm2.

The resistor according to the present invention may be produced using the following process.

The first step is to form a system comprising a structure of one or more networks of electrically conductive wires, and a liquid material arranged between the said wires. The said liquid material should be selected from among those capable of assuming a state wherein they are both solid and flexible. The said process then consists in solidifying the said liquid material, so as to form a solid, flexible supporting matrix for the said network structure. The said fluid material, the viscosity of which ranges from 500 to 10,000 centipoise, may be solidified either by simply allowing it to cool, or by means of curing, and may conveniently consist of synthetic resin, in particular, thermoplastic resin. During the period in which the initial material is being solidified, the said system is subjected to a given pressure perpendicular to the plane in which the structural networks are arranged.

For arranging the initial liquid material between the wires of the said structural networks, these may be inpregnated separately with the said material and then arranged one on top of the other, so as to form the said system. Alternatively, it may be preferable, as described later on, to inject the said material directly into a structure consisting of a number of networks arranged one on top of the other.

The said process conveniently comprises the following four stages.

A first stage wherein a structure 20 (FIG. 7) is formed consisting of a pack of electrically conductive wire networks arranged one on top of the other.

A second stage wherein the said structure 20 is subjected in any appropriate manner, e.g. by means of a thrust element 22, to a given pressure sufficient to bring the adjacent wire networks substantially into contact with one another.

A third stage wherein the said liquid material is injected into the said structure 20, e.g. by placing liquid material 23 inside a tank 24 communicating with structure 20 via a hole 25 in thrust element 22, and subjecting material 23 to the action of an appropriate piston 21. The feed pressure of material 23 is selected so as to ensure the said material is injected between the wires of the networks in structure 20 so as to substantially fill in the gaps between the said wires.

A fourth stage wherein the liquid material inside structure 20 is solidified, so as to form a supporting matrix for the said structure. This stage, shown schematically in FIG. 9, consists in subjecting structure 20 to a given pressure, conveniently the same pressure at which the networks in structure 20 are compacted in stage two.

As already stated, the liquid material impregnating structure 20 may be solidified by simply allowing it to cool. During this stage, changes may be observed in the structure of the material, due for example, to curing of the same.

The resulting product may be cut, using standard mechanical methods, into any shape or size for producing electric resistors as required. The process as described above may obviously be adjusted for producing resistors with network structures 20 comprising only one network.

To those skilled in the art it will be clear that changes may be made to both the electric resistor and the relative manufacturing process as described and illustrated herein without, however, departing from the scope of the present invention.

I claim:

1. An electric resistor designed for use as an electric conducting element in an electric circuit, comprising a structure of:

a plurality of networks of electrical conductive wires each of which comprises weft wires separated from each other by warp wires, a matrix formed by a flexible, electrically insulating material in which said weft and warp wires are sunk;

said networks being superimposed in the material of said matrix in such a way to obtain a regular configuration in which first sets of weft and warp wires are in contact with each other and second sets of weft and warp wires are separated from each other;

said matrix formed by said flexible insulating material defining small gaps each of which is positioned between a warp and a weft wire of one said second set.

2. An electric resistor according to claim 1; wherein said plurality of networks are arranged one on top of each other.

3. An electric resistor according to claim 1; wherein said wires in said networks are formed from electrically conductive material.

4. An electric resistor according to claim 1; wherein said wires in said networks have a coating of electrically conductive material.

5. An electric resistor according to claim 1; where said electrically insulating material of said matrix is designed to assume a first liquid state in which it is sufficiently fluid to be injected into a structure comprising a number of overlayed wire networks so as to produce a supporting matrix into which said networks are sunk, and a second state in which it is both solid and flexible.

6. An electric resistor according to claim 5; wherein said insulating material of said matrix in the liquid state has a viscosity ranging from 500 to 10,000 centipoise.

7. An electric resistor according to claim 1; wherein said flexible, electrically insulating material used for said matrix is a synthetic resin.

8. An electric resistor according to claim 7; wherein said flexible, electrically insulating material used for said matrix is a thermoplastic resin.

9. A method for producing an electric resistor for use as an electric conducting element in an electric circuit, said method comprising the steps of:

forming a structure including at least one network of electrically conductive wires;

arranging a liquid material between the wires of each said network in said structure, said liquid material being capable of assuming a state in which it is both solid and flexible; and subsequently solidifying said liquid material so as to form a solid, flexible matrix for supporting said structure.

10. A method according to claim 9; further including the step of subjecting said structure to a given pressure perpendicular to a plane in which said at least one network lies, during solidification of said liquid material.

11. A method according to claim 9; further including the step of solidifying said liquid material by means of cooling.

12. A method according to claim 9; further including the step of solidifying said liquid material by means of curing.

13. A method according to claim 9; further including the steps of subjecting said formed structure of at least one network to a given pressure; injecting said liquid material into said structure so that the liquid material penetrates between wires of said at least one network; and solidifying said liquid material so as to produce a supporting matrix for said structure and in which said given pressure is exerted on said structure.

* * * * *